(12) United States Patent
Lee et al.

(10) Patent No.: US 6,188,631 B1
(45) Date of Patent: Feb. 13, 2001

(54) SEMICONDUCTOR MEMORY DEVICE COLUMN SELECT CIRCUIT AND METHOD FOR MINIMIZING LOAD TO DATA INPUT/OUTPUT LINES

(75) Inventors: Jung-bae Lee; Woo-pyo Jeong, both of Suwon (KR)

(73) Assignee: Samsung Electronics Co., LTD (KR)

( * ) Notice: Under 35 U.S.C. 154(b), the term of this patent shall be extended for 0 days.

(21) Appl. No.: 09/498,858

(22) Filed: Feb. 7, 2000

(30) Foreign Application Priority Data

Apr. 27, 1999 (KR) .................................................. 99-15028
Jun. 29, 1999 (KR) .................................................. 99-25343

(51) Int. Cl.$^7$ ...................................................... G11C 8/00
(52) U.S. Cl. ................................ 365/230.03; 365/230.06
(58) Field of Search ........................ 365/230.03, 230.06, 365/203, 207, 189.05

(56) References Cited

U.S. PATENT DOCUMENTS

| | | | | |
|---|---|---|---|---|
| 4,916,336 | * | 4/1990 | Houston | 365/230.06 |
| 5,822,268 | * | 10/1998 | Kirimata | 365/230.03 |
| 5,848,011 | * | 12/1998 | Muraoka et al. | 365/207 |
| 5,923,605 | * | 7/1999 | Mueller et al. | 365/230.03 |
| 6,064,622 | * | 5/2000 | Lee et al. | 365/230.06 |
| 6,088,284 | * | 7/2000 | Lee et al. | 365/230.03 |
| 6,088,293 | * | 7/2000 | Ho | 365/230.06 |

OTHER PUBLICATIONS

Jei–Hwan Yoo, et al., "A 32–Bank 1Gb DRAM with 1GB/s Bandwidth," IEEE International Solid–State Circuits Conferednce, 1996, pp. 378–379.

Takanori, Saeki, et al., "A 2.5ns Clock Access 250MHz 256Mb SDRAM with a Synchronous Mirror Delay," IEEE International Solid–State Ciricuits Conference, 1996, pp. 374–375.

* cited by examiner

Primary Examiner—Tan T. Nguyen
(74) Attorney, Agent, or Firm—Samuels, Gauthier & Stevens LLP

(57) ABSTRACT

A column select circuit capable of minimizing load to data input/output lines, a semiconductor memory device having the same, and an arrangement method for the semiconductor memory device are described. In the semiconductor memory device having column select circuits, each column select circuit selects one of at least two banks in a memory block and selects a predetermined bit line among a plurality of bit lines in the selected bank to transfer data of the selected bit line to data input/output line. The column select circuit includes one or more first select portions for connecting the bit lines of the selected bank to the corresponding first data lines in response to a bank select signal to select a predetermined bank. One or more second select portions connects the first data lines to a second data line in response to each column select signal which represents the address of each bit line. A third select portion connects the second data line to the data input/output lines in response to the bank select signal. The second data line shared by the second select portions is connected to at least one first data line which is responsive to the column select signal.

20 Claims, 11 Drawing Sheets

SEMICONDUCTOR MEMORY DEVICE COLUMN SELECT CIRCUIT AND METHOD FOR MINIMIZING LOAD TO DATA INPUT/OUTPUT LINES

BACKGROUND OF THE INVENTION

1. Field of the Invention

The present invention relates to a semiconductor memory device, and more particularly, to a column select circuit for minimizing load to data input/output lines of a semiconductor device, a semiconductor memory device having the same, and a method of arranging the column select circuits in the semiconductor memory device.

2. Description of the Related Art

In general, approaches to improving performance of computer systems include improving the operational speed of the central processing unit (CPU) as well as the performance of memory devices that store data or programs required by the CPU. To improve the performance of the memory device, the bandwidth per unit time should be increased. The bit line data of a memory cell is selectively transferred to the data input/output lines through data input/output circuits, depending on the number of data input/output lines. Generally, the amount of data read from or written to the memory in a given time period, i.e., the bandwidth, directly depends on the number of data input/output lines.

The memory cell data loaded onto the data input/output lines of a semiconductor memory device determines the operational speed of the device. The operational speed of the semiconductor memory device is determined by the time between sensing the data stored in the memory cell to be read and outputting the data to the data input/output lines, or the duration required to transmit data to be written from the data input/output lines to the memory cell. Thus, the load applied to the data input/output lines should be reduced in order to prevent the operational speed of the semiconductor memory device from being reduced. The data input/output lines are connected to column select circuits, and thus a column select circuit should be able to minimize the load to the data input/output lines.

SUMMARY OF THE INVENTION

It is an object of the present invention to provide a column select circuit for minimizing the load applied to data input/output lines.

It is another object of the present invention to provide a semiconductor memory device having such a column select circuit.

It is still another object of the present invention to provide an efficient method of arranging the column select circuits in the semiconductor memory device.

To achieve the first object of the present invention, there is provided a semiconductor memory device having column select circuits, each column select circuit selecting one of at least two banks in a memory block and selecting a predetermined bit line among a plurality of bit lines in a selected bank to transfer data of the selected bit line to a data input/output line. The column select circuit includes a plurality of first select portions for connecting the bit lines of the selected bank to a corresponding first data lines in response to a bank select signal to select a predetermined bank. The column select circuit also includes a plurality of second select portions for connecting the first data lines to a second data line in response to a column select signal which represents the address of each bit line. The column select circuit also includes a third select portion for connecting the second data line to the data input/output lines in response to the bank select signal. The second data line shared by the second and third select portions is connected to at least one of the first data lines which is responsive to the column select signal.

To achieve the second object of the present invention, there is provided a semiconductor memory device for selecting a bank among a plurality of banks sharing data input/output lines. The banks are arranged in rows and columns. The device selects a predetermined bit line among a plurality of bit lines in the selected bank to transfer the data of the selected bit line to the data input/output lines. The semiconductor memory device includes column select circuits arranged between the banks. Each column select circuit is shared by the neighboring banks for transferring data of the selected bit line to the data input/output lines. Each column select circuit includes a plurality of first select portions for connecting the bit lines of the selected bank to the corresponding first data lines in response to a bank select signal to select a predetermined bank. Each column select circuit also includes a plurality of select portions for connecting the first data lines to a second data line in response to each column select signal which represents the address of each bit line. Each column select circuit also includes a third select portion for connecting the second data line to the data input/output lines in response to the bank select signal.

To achieve the third object of the present invention, there is provided an arrangement method for a semiconductor memory device for selecting a bank among at least two banks which share data input/output lines, the banks being arranged in units of memory blocks, and selecting a predetermined bit line among a plurality of bit lines in the selected bank, to transfer the data of the selected bit line to the data input/output lines. The semiconductor memory device includes a bit line sense amplifier for sensing the data of the bit lines and a column select circuit. The column select circuit (i) connects the bit lines of the selected bank to the corresponding first data lines through first select portions in response to a bank select signal to select a predetermined bank, (ii) connects the first data lines to a second data line through second select portions in response to each column select signal which represents the address of each bit line, and (iii) connects the second data line to the data input/output lines in response to the bank select signals. A sense amplifier power driver supplies power voltage to the bit line sense amplifier, and a data line equalizer equalizes the second data line. The sense amplifier power driver and the data line equalizer are arranged in the bit line sense amplifier region between the banks.

According to the present invention, even though the data input/output lines are shared by a number of banks, the junction load to the data input/output lines can be minimized. This is because the signal lines for column select signals, which are connected to second select portions of the column select circuit, are arranged in a direction parallel to the bit lines. Also, the data line equalizers and the sense amplifier power drivers are arranged in the bit line sense amplifier regions of the column select circuit, so that the chip size does not increase.

DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Preferred embodiments of the present invention now will be described with reference to the accompanying drawings. This invention may, however, be embodied in many different forms and should not be construed as being limited to the embodiments set forth herein.

Rambus DRAM comprises a number of banks RB0, RB1, . . . , RB15 arranged in a row direction, and a number of memory blocks DQ0~DQ15 arranged in a column direction, which share a group of global data lines. The number of global data lines IO and IOB can be varied according to the memory architecture of the Rambus DRAM, however, a memory architecture including four global data lines IO and IOB will be described in connection with the following embodiments of the invention.

Column Select Circuit

Figure 1:
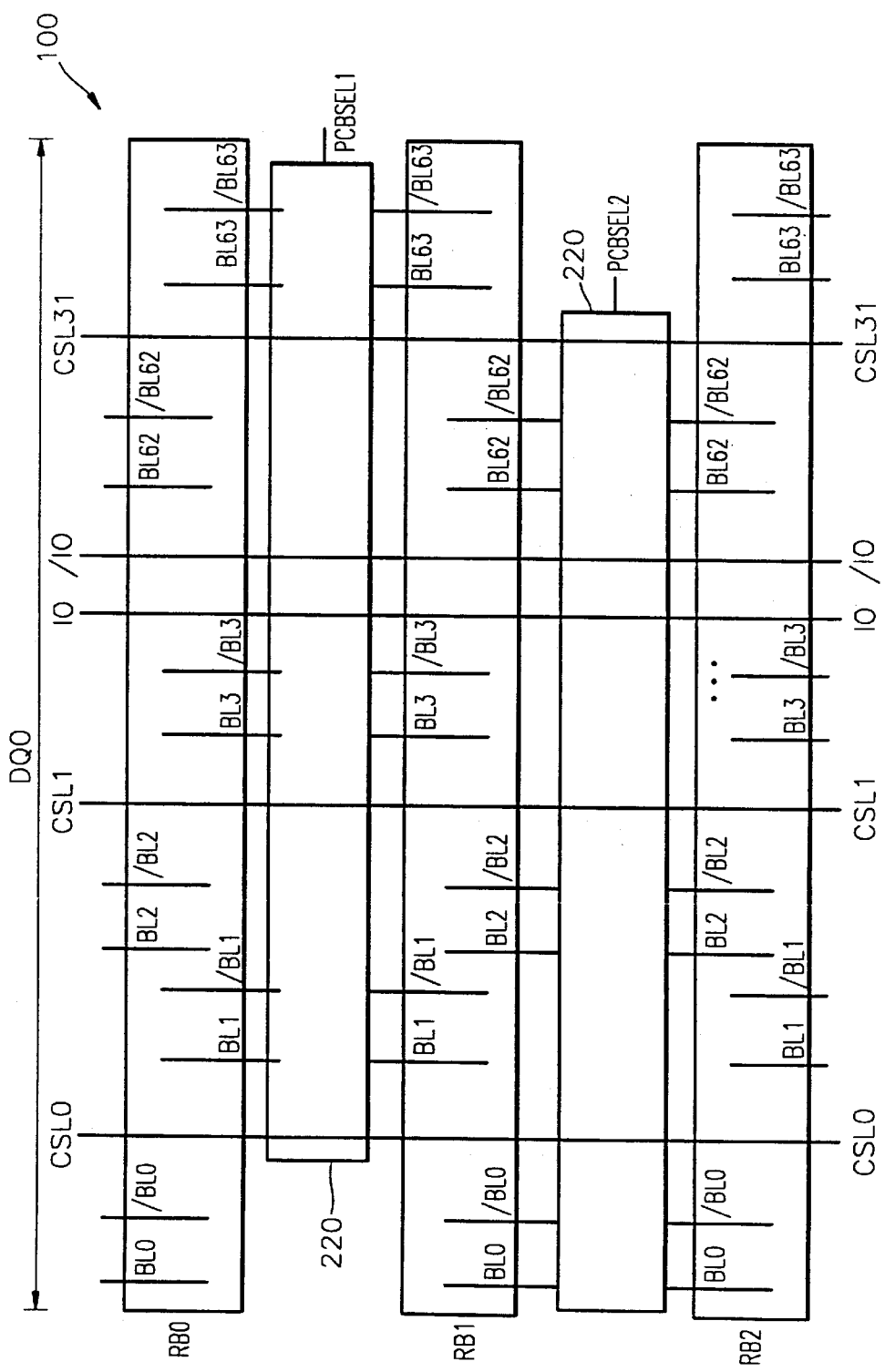
FIG. 1 is a schematic diagram illustrating one embodiment of a column select circuit according to the present invention, and a portion of a semiconductor memory device having the column select circuit of the invention.
Figure 2:
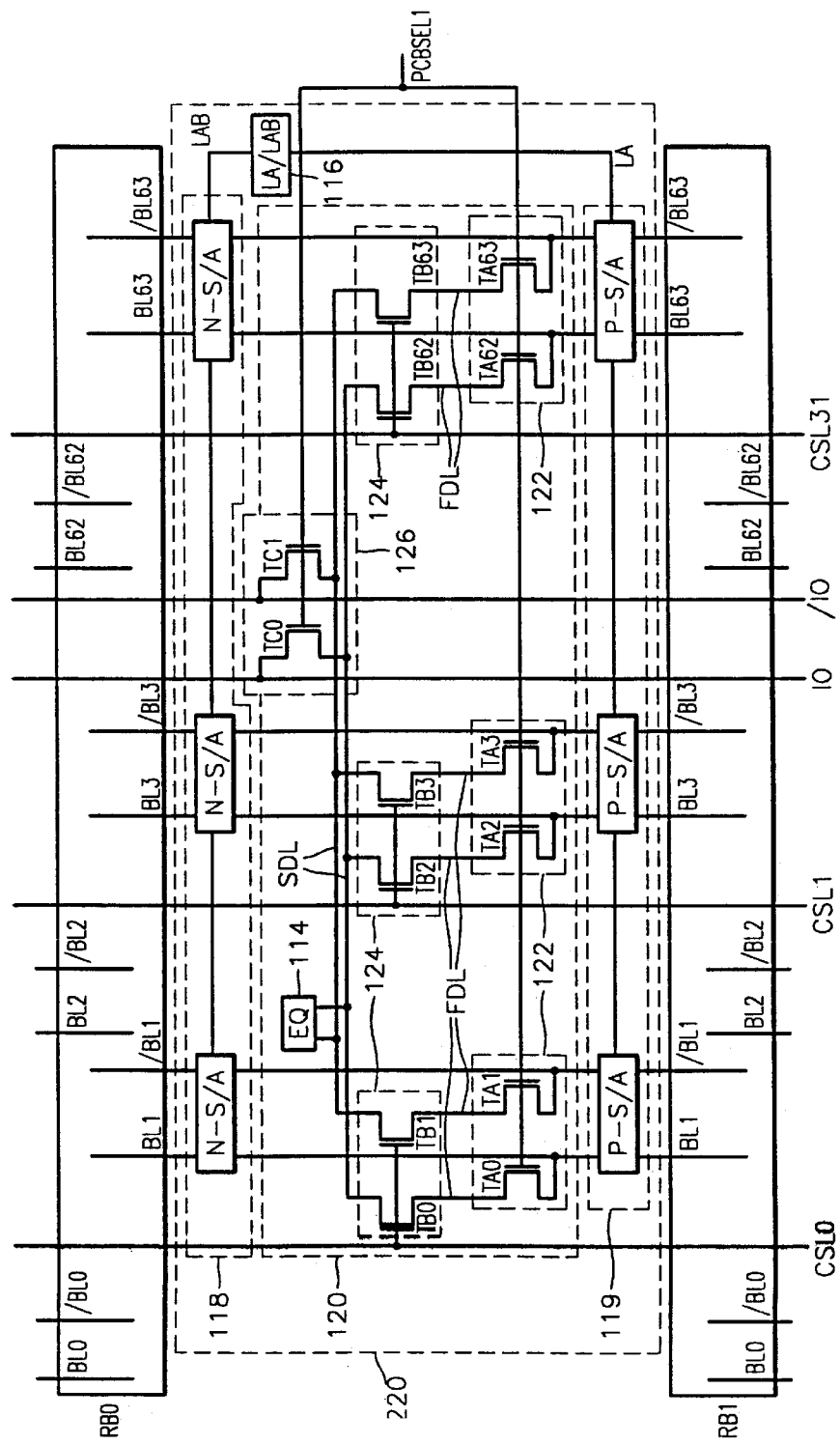
FIG. 2 contains a detailed schematic block diagram which illustrates an upper portion of the semiconductor memory device shown in FIG. 1.
Figure 3:
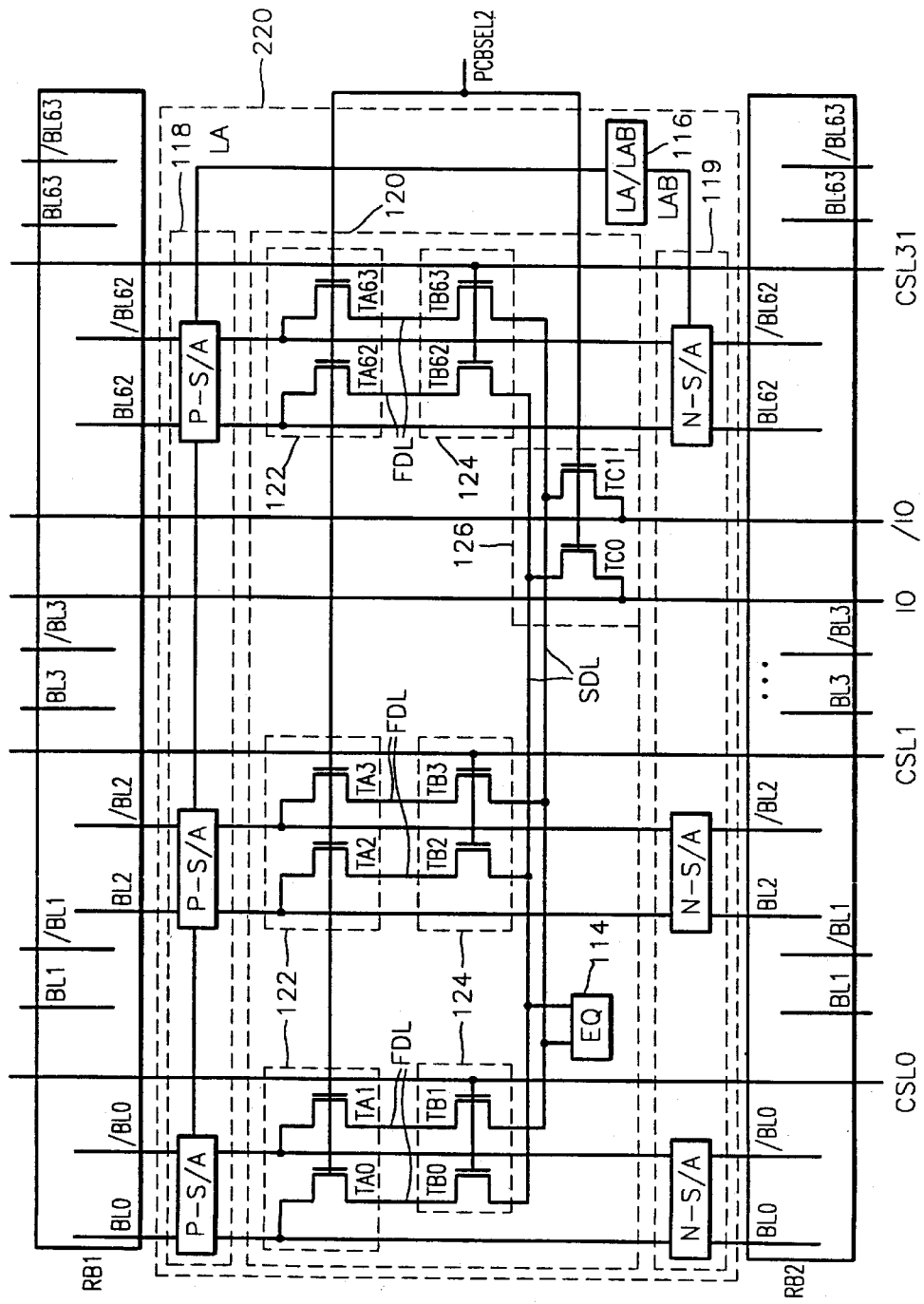
FIG. 3 contains a detailed schematic block diagram which illustrates a lower portion of the semiconductor memory device shown in FIG. 1.

FIGS. 1–3 illustrate one embodiment of a semiconductor memory device and column select circuit according to the invention. FIG. 1 shows a part of a semiconductor memory device 100 which includes the a column select circuit 120 according to the present invention. Upper and lower portions of the semiconductor memory device 100 are shown in detail in FIGS. 2 and 3.

As shown in FIG. 2, the upper part of the semiconductor memory device 100 comprises two neighboring first and second banks RB0 and RB1, and a data input/output circuit 220 having sense amplifiers 118 and 119 and a column select circuit 120, between the first and second banks RB0 and RB1. The column select circuit 120 selects a predetermined number of bit line pairs among a plurality of bit lines of the selected bank RB0 or RB1 and transfers the selected bit line pairs to a number of pairs of global data lines IO and /IO.

The number of the global data lines IO and /IO can be varied. In a preferred embodiment, an example of a pair of global data lines IO and IOB, which are connected to 64 bit line pairs, is described in order to simplify the illustrations of the drawings.

32 odd bit line pairs BLi and /BLi (where i=2n+1 and n=0~31), which account for half of the 64 bit line pairs BLi and /BLi (i=0~63) of the first bank RB0, are coupled to the lower part of the first bank RB0, and the remaining 32 even bit line pairs BLi and /BLi (i=2n and n=0~31) are coupled to the upper part of the first bank RB0. In contrast, 32 even bit line pairs BLi and /BLi (i=2n and n=0~31), which account for half of the 64 bit line pairs BLi and /BLi (i=0~63) of the second bank RB1, are coupled to the lower part of the second bank RB1, and the remaining 32 odd bit line pairs BLi and /BLi (i=2n+1 and n=0~31) are coupled to the upper part of the second bank RB1.

32 odd bit line pairs BLI and /BLi (i=2n+1 and n=0~31) of the first bank RB0 and 32 odd bit line pairs BLi and /BLi (i=2n+1 and n=0~31) of the second bank RB1 are coupled respectively, and share NMOS or PMOS sense amplifiers N-S/A and P-S/A. The sense amplifiers 118 and 119 having the NMOS and PMOS amplifiers N-S/A and P-S/A, respectively, sense bit line data of the selected bank and transfer the sensed bit line data to the column select circuit 120.

A sense amplifier ground signal LAB having a ground voltage level and a sense amplifier power signal LA having a power voltage level are provided to the sense amplifiers 118 and 119, respectively, and the sense amplifier ground signal LAB is connected to the ground voltage of the NMOS sense amplifier N-S/A while the sense amplifier power signal LA is connected to the power voltage of the PMOS amplifier P-S/A.

Figure 4:
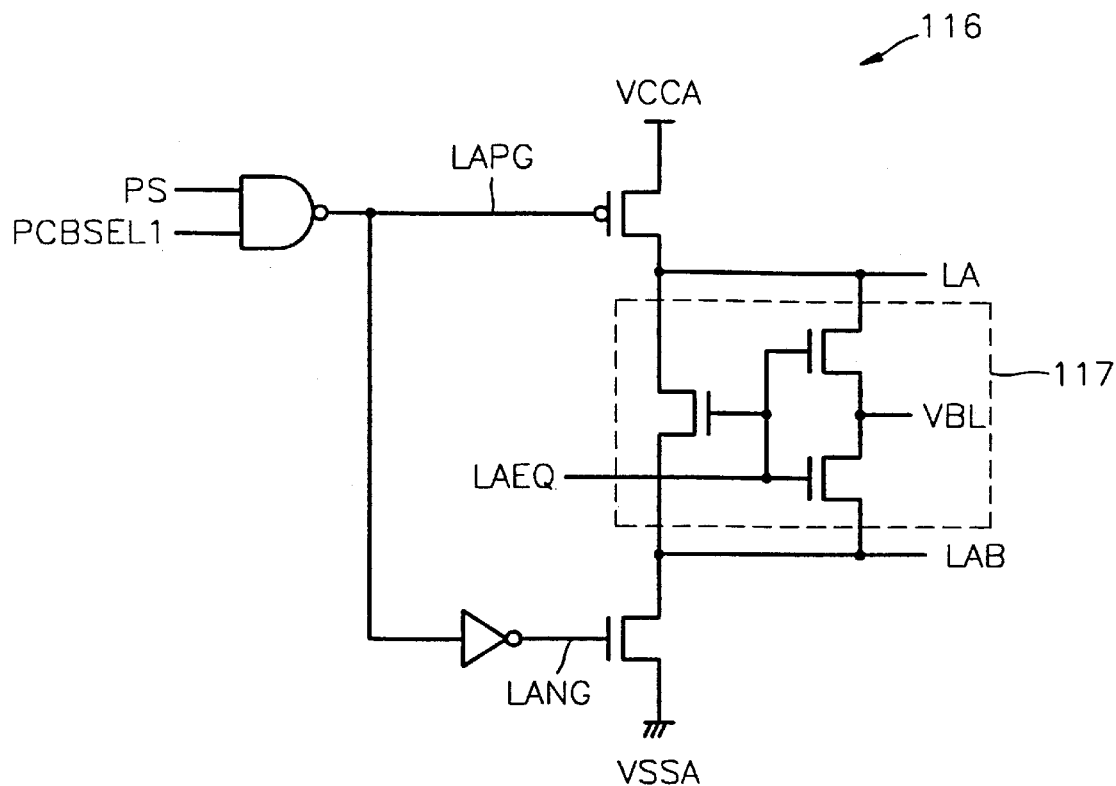
FIG. 4 is a schematic circuit diagram of one embodiment of the sense amplifier power driver in FIG. 2, according to the present invention.

FIG. 4 shows one embodiment of the sense amplifier power driver 116 in detail. Referring to FIG. 4, the sense amplifier power driver 116 generates a PMOS sensing enable signal LAPG, which directs the supply of the power supply voltage VCCA to the PMOS sense amplifier P-S/A. In similar fashion, the power driver 116 also generates an NMOS sensing enable signal LANG which directs the supply of the ground voltage VSSA to the NMOS sense amplifier N-S/A. These two signals are generated in response to a logic high band select signal PCBSEL1 and a logic high sensing enable signal PS which controls the sensing of bit lines. Power supply voltage VCCA and ground voltage VSSA are supplied to the power voltage LA of the PMOS sense amplifier P-S/A and the ground voltage LAB of the NMOS sense amplifier N-S/A, respectively, in response to the activation of the logic low PMOS sensing enable signal and of the logic high NMOS sensing enable signal LANG. Also, while the sense amplification does not occur, the sense amplifier power driver 116 applies a precharge voltage VBL, corresponding to half of the power voltage VCCA, to the power voltage LA of the PMOS sense amplifier P-S/A and the ground voltage LAB of the NMOS sense amplifier N-S/A through an equalizer 117 which responds to an equalizer signal LAEQ of the sense amplifier power driver 116.

The column select circuit 120 of FIG. 2 selects one bit line pair transferred through the sense amplifiers 118 and 119 from among the 64 bit line pairs of the selected bank between neighboring banks RB0 and RB1. This example illustrates that the column select circuit 120 selects one bit line pair from the second bank RB1.

Referring to FIG. 2, the column select circuit 120 comprises first through third select portions 122, 124 and 126. The first select portion 122 connects the 32 bit line pairs of the upper part of the second bank RB1 to first data line pairs FDL in response to the bank select signal PCBSEL1 which indicates the selection of the second bank RB1. The first select portions 122 include first NMOS transistors TAi (i=0~63) each having a gate connected to the band select signal PCBSEL1, a source connected to the bit line BLi (i=2n+1 and n=0~31) and a drain connected to the first data line FDL. Here, the bank select signal PCBSEL1 is provided by a bank select signal generating circuit which will be described in detail below. Briefly, the bank select signal PCBSEL1 selects bit lines to be connected to the upper part of the second bank RB1 according to a column address latch signal and bank addresses. Signal lines for the bank select signal PCBSEL1 are provided into the first select portions 122 and the third select portion 126 in a direction perpendicular to the bit lines of the second bank RB1, that is, in the direction parallel to word lines.

The second select portions 124 connect the first data line pairs FDL corresponding to the column select signals CSLi (i=0~31) among the first data line pairs FDL transferred from the first select portions 122, to second data line pairs SDL, in response to each column select signal CSLi (i=0~31), which indicate addresses of the bit lines of the second bank RB1. The second select portions 124 include second NMOS transistors TBi (i=0~63) each having a gate connected to a corresponding column select signal CSLi (i=0~31), a source connected to a first data line FDL and a drain connected to a second data line SDL.

Figure 5:
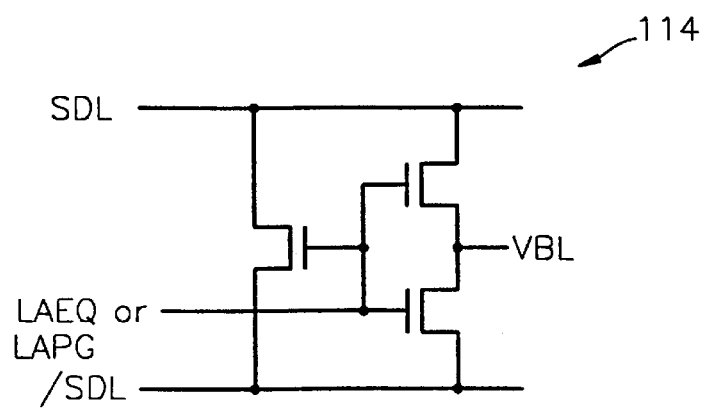
FIG. 5 is a schematic circuit diagram of one embodiment of the data line equalizer in FIG. 2, according to the present invention.

Here, the second data line pairs SDL are called local data lines. A data line equalizer 114 is connected to the second data line pairs SDL. The data line equalizer 114 shown in FIG. 5 can be the same as the equalizer 117 of the sense amplifier power driver 116 of FIG. 4. The data line equalizer 114 applies a precharge voltage VBL to the second data line pair SDL in response to the logic high equalizer signal LAEQ or PMOS sensing enable signal LAPG of the sense amplifier power driver 116 (see FIG. 4).

The control of the data line equalizer 114 by the equalizer signal LAEQ or the PMOS sensing enable signal LAPG coincides with the operation of the sense amplifiers 118 and 119 (see FIG. 2) in response to the equalizer signal LAEQ and the PMOS sensing enable signal LAPG. That is, in the operation of the sense amplifiers 118 and 119, when a precharge voltage VBL is applied to the power voltage LA and the ground voltage LAB of the sense amplifiers 118 and 119 in response to the logic high equalizer signal LAEQ, or the power supply voltage VCCA is not supplied to the power voltage LA of the sense amplifier 118 in response to the logic high PMOS sensing enable signal LAPG, the second data lines are precharged by a precharge voltage in response to the equalizer signal LAEQ or the PMOS sensing enable signal LAPG, so that the operation of the sense amplifiers 118 and 119 stops.

The third select portion 126 connects the second data line pair SDL selected by the second select portion 124 to the data input output line pair IO and /IO, in response to the bank select signal PCBCEL1. The third select portion 126 comprises third NMOS transistors TCi (i=0, 1) each having a gate connected to the bank select signal PCBSEL1, a source connected to the second data line SDL and a drain connected to the data input/output line IO and /IO.

Thus, in the column select circuit 120, the first NMOS transistors TAi (i=0~63) of the first select portions 122 transfer the data of the bit lines of the second bank RB1 through the first data line pairs FDL to the second NMOS transistors TBi (i=0~63) of the second select portions 124, respectively, in response to the bank select signal PCBSEL1 applied to the gates of the first NMOS transistors TAi (i=0~63) of the first select portions 122. Each of the second NMOS transistors TBi (i=0~63) of the second select portions 124 selects one of the first data line pairs FDL in response to the column select signal CSLi (i=0~31) applied to each gate, and transfers the data of the selected first data line pair through the second data lines SDL to the third NMOS transistors TCi (i=0, 1) of the third select portion 126. The third NMOS transistors TCi (i=0,1) of the third select portion 126 transfer the data of the second data line pair SDL to the data input/output line pair IO and /IO in response to the bank select signal PCBSEL1 applied to the gates.

In the column select circuit 120, the data input/output line IO connected to the second bank RB1 has a junction load of only two third NMOS transistors TCO connected to the upper and lower parts of the second bank RB1, respectively. The data input/output lines IO and /IO can minimize the junction load even if they are shared by the data input/output lines provided by a number of banks.

Also, the second select portions 124 of the column select circuit 120 are connected to the column select signals CLSi (I=0~31), which are arranged parallel to the bit lines. Because the third select portion 126 has only two third NMOS transistors TCO and TCI, some area is secured in a horizontal direction of the third select portion 126. The sense amplifier power driver 116 and the data line equalizer 114 can be arranged in that same area, so that the chip size can be significantly reduced. This advantage will be described in detail below with reference to FIG. 13, which illustrates a comparative example to that of FIG. 2. The description of the lower part of the semiconductor memory device, shown in FIG. 3, is omitted because the operation of the lower part is similar to that of the upper part, described with reference to FIG. 2.

First Layout of Arrays

Figure 6:
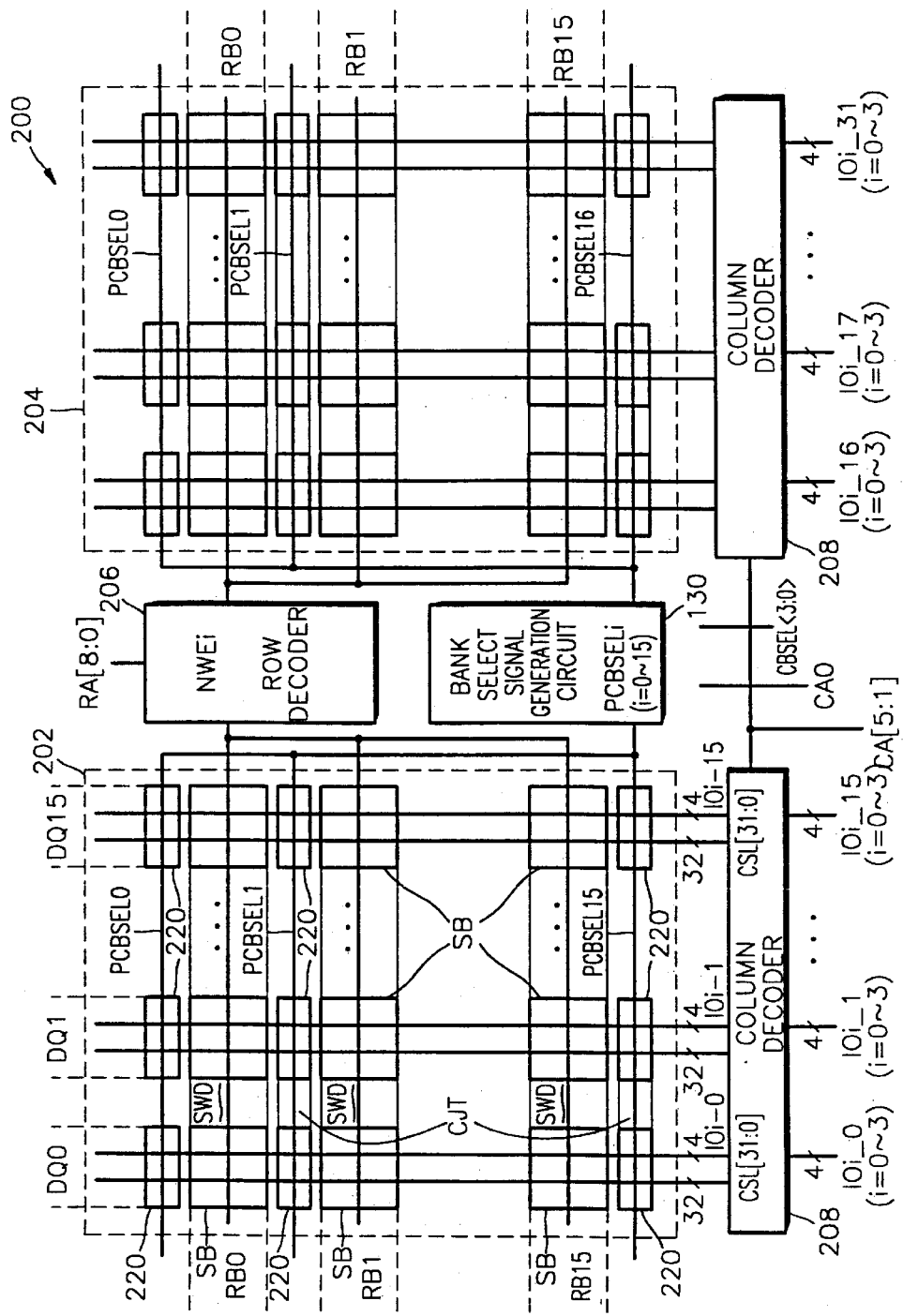
FIG. 6 schematically illustrates a layout of one embodiment of the entire semiconductor memory device having the column select circuits according to the present invention.

FIG. 6 illustrates an overall layout of the arrays of a semiconductor memory device including the column select circuit of FIG. 2. Referring to FIG. 6, a semiconductor memory device 200 comprises memory blocks 202 and 204, a row decoder 206, a bank select signal generating circuit 130, a column decoder 208, and an interface logic unit (not shown) which provides a protocol for communications with an external channel.

Each of memory blocks 202 and 204 comprises 16 banks RBi (i=0~15) arranged in the row direction, 16 DQi (i=0~15) blocks intersecting each bank RBi in the column direction, and a plurality of sub-blocks SB matched by the 16 banks RBi and DQi blocks. Each of the sub-blocks SB includes 512 word lines and 256 bit lines. Also, each of the memory blocks 202 and 204 includes data input/output circuits 220, each data input/output circuit including the column select circuit 120 (see FIG. 2), which connect the bit lines in the sub-block SB to data input/output lines, and the sub-blocks SB of one DQi (i=0~15) block share four data input/output lines IOi_n (i=0~3 and n=0~31).

The row decoder 206 arranged between the memory blocks 202 and 204 decodes row addresses RA[6:2] among externally input row addresses RA[8:0], to generate 128 word line enable signals NWEi, and decodes the least significant addresses RA[1:0] to generate four word line driving signals (not shown). One of the 512 word lines in a sub-block SB is selected in a sub-word line driver (SWD) in response to four word line driving signals connected to one of the word line enable signals NWEi. The partitioning driving method, in which the row decoder 206 and the sub-word line driver SWD are used to enable the word line WL (not shown), can minimize the delay due to an inevitable increase in the load to the word lines as the memory capacity increases.

Also, conjunctions CJT where the sub-word line driver SWD regions and bit line sense amplifier regions intersect each other, receive control signals such as an equalizer signal LAEQ (not shown), sensing enable signals LAPG and LANG (not shown) and bank select signals PCBSELi (i=0~15) generated by a bank select signal generating circuit 130 which will be described below.

The bank select signal generating circuit 130 generates the bank select signal PCBSELi (i=0~15) to select the banks RBi (i=0~15) to be connected to the column select circuit 120 (see FIG. 2). The bank select signal PCBSELi (i=0~15) is for connecting the column select circuit 120 which is shared by neighboring banks RB0 and RB1, to the selected bank.

Figure 7:
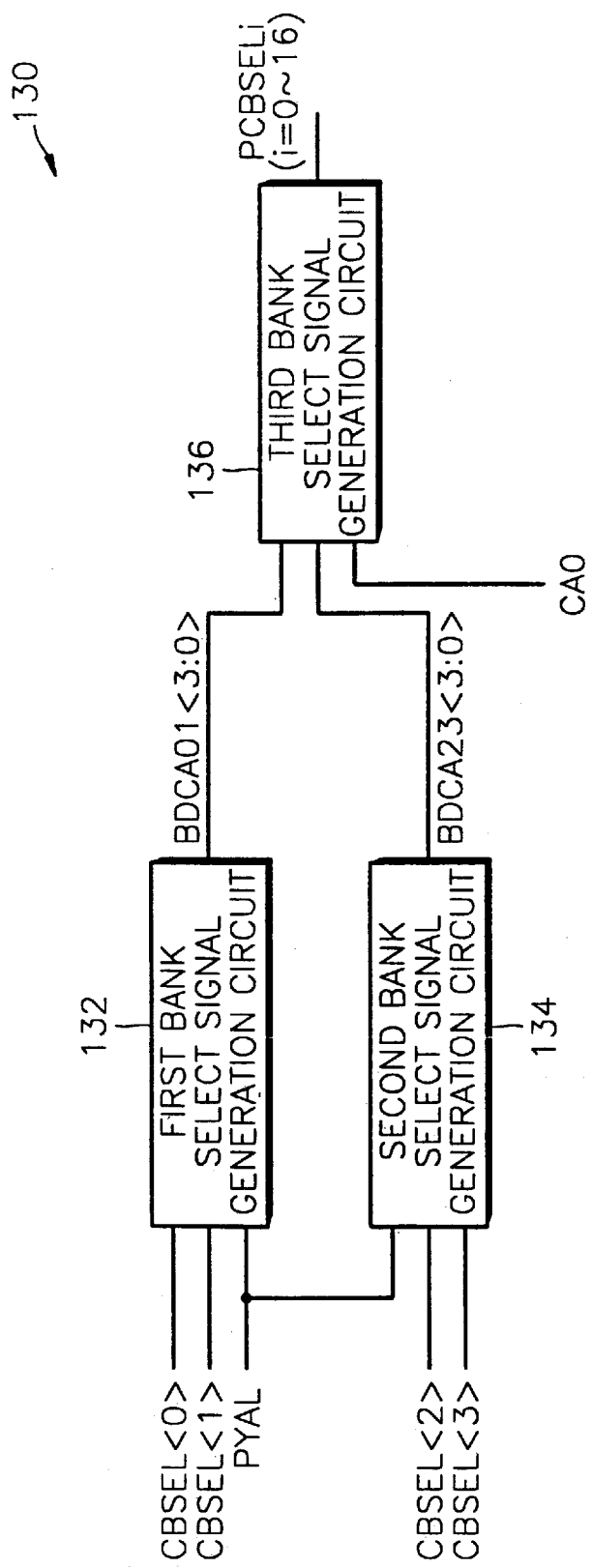
FIG. 7 is a block diagram of one embodiment of the bank select signal generating circuit of FIG. 6, according to the present invention.

FIG. 7 illustrates one embodiment of the bank select signal generating circuit 130 in detail. Referring to FIG. 7, the bank select signal generating circuit 130 receives a column address CA0, a column address latch signal PYAL, and first through fourth bank addresses CBSEL<0>, CBSEL<1>, CBSEL<2> and CBSEL<3> to generate a bank select signal PCBSELi (i=0~15) for selecting one of a number of banks, for example, one among 16 banks. In detail, the bank select signal generating circuit 130 comprises first, second and third bank select signal generating circuits 132, 134 and 136.

The first bank select signal generating circuit 132 generates first through fourth bank decoding signals BDCA01<i> (i=0~3) in response to the column address latch signal PYAL and the first and second bank addresses CBSEL<0> and CBSEL<1>. In detail, referring to FIG. 8, the first bank select signal generating circuit 132 decodes the first and second bank addresses CBSEL<0> and CBSEL<1> to generate first through fourth pre-bank decoding signals p_BDCA01<i> (i=0~3), in which one of the first through fourth pre-bank decoding signals p_BDCA01<i> (i=0~3) is logic low. The first through fourth pre-bank decoding signals p_BDCA01<i> (i=0~3) are transmitted as first through fourth bank decoding signals BDCA01<i> (i=0~3) in response to the column address latch signal PYAL. Here, the first through fourth bank decoding signals are inverted versions of the first through fourth pre-bank decoding signals p_BDCA01<i> (i=0~3).

Figure 8:
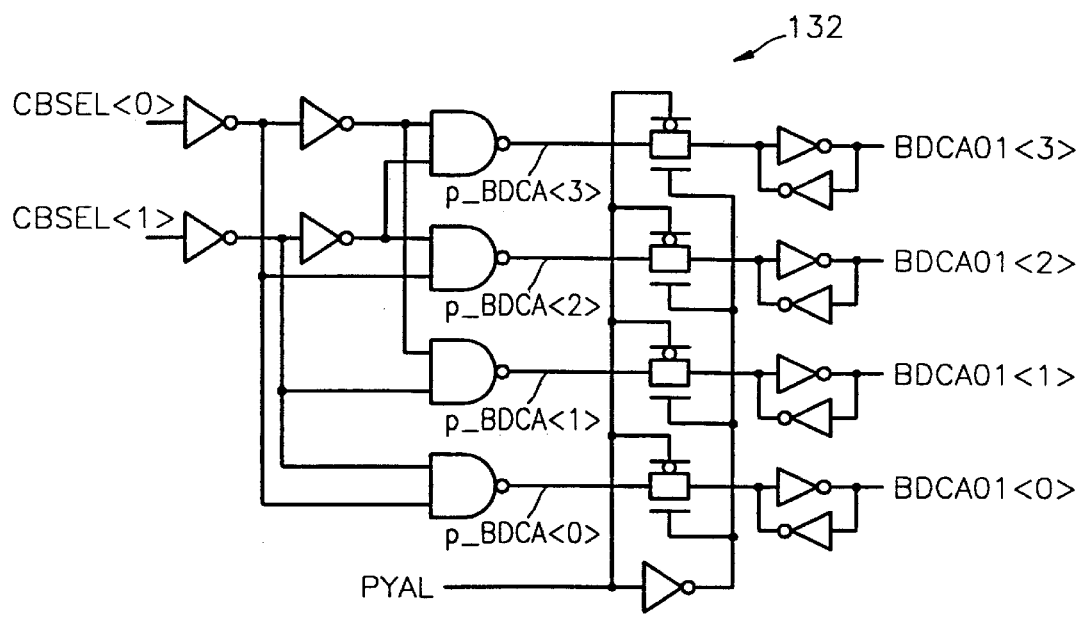
FIG. 8 is a detailed schematic diagram of one embodiment of the first bank select signal generating circuit of FIG. 7, according to the present invention.
Figure 9:
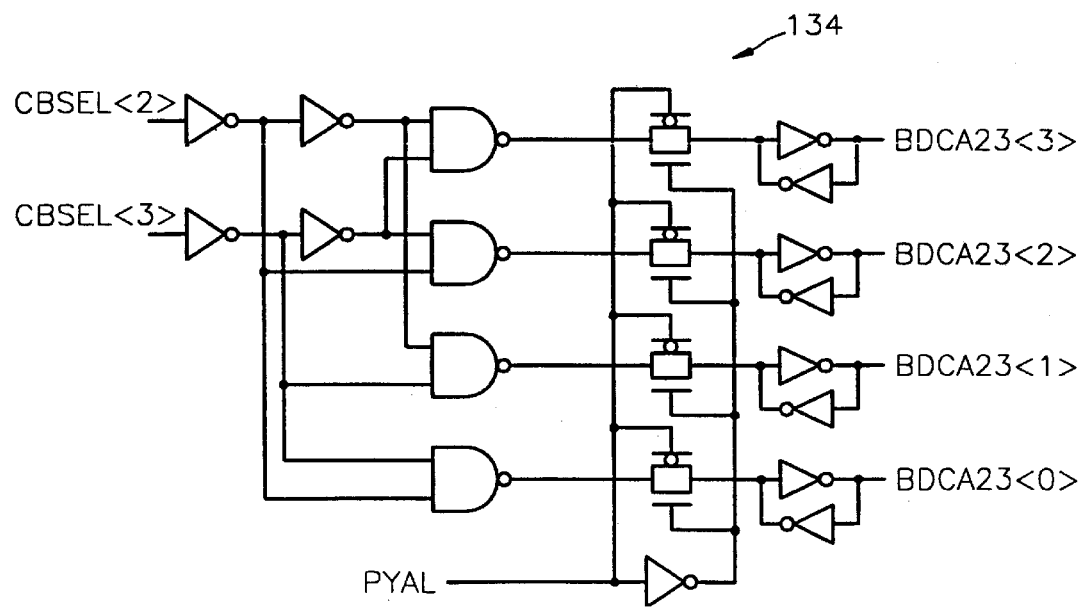
FIG. 9 is a detailed schematic diagram of one embodiment of the second bank select signal generating circuit of FIG. 7, according to the present invention.

FIG. 9 is a detailed circuit diagram of the second bank select signal generating circuit 134 of FIG. 7. The second bank select signal generating circuit 134 is nearly the same as the first bank select signal generating circuit 132 of FIG. 8, except for the bank addresses. Briefly, instead of the first and second bank addresses CBSEL<0> and CBSEL<1> of FIG. 8, the second bank select signal generating circuit 134 decodes third and fourth bank addresses CBSEL<2> and CBSEL<3> to generate fifth through eighth bank decoding signals BDCA23<i> (i=0~3) in response to the column address latch signal PYAL. Description of the portion of the second bank select signal generating circuit of FIG. 9 having the same structure as the first bank select signal generating circuit of FIG. 8 is omitted in order to avoid redundancy.

Figure 10:
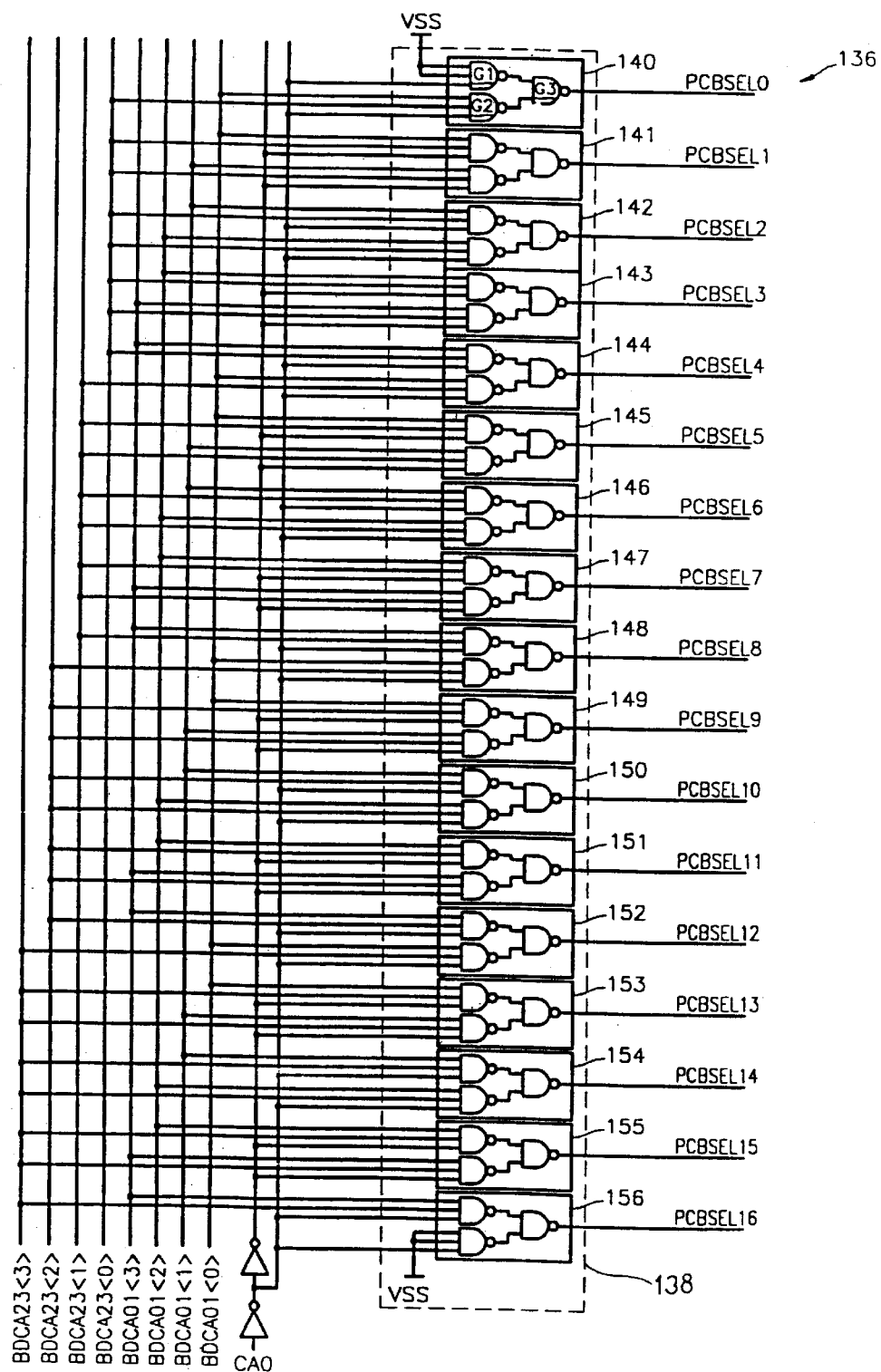
FIG. 10 is a detailed schematic diagram of one embodiment of the third bank select signal generating circuit of FIG. 7, according to the present invention.

FIG. 10 is a detailed circuit diagram of the third bank select signal generating circuit 136 of FIG. 7. The third bank select signal generating circuit 136 comprises a bank decoding portion 138 for combining first through eighth bank decoding signals BDCA01<i> and BDCA<i> (i=0~3), the column address CA0 and the inverted column address /CA0. The bank decoding portion 138 comprises 17 bank decoders 140, 141, . . . , 156, and each bank decoder combines four among the first through eighth bank select signals BDCA01<i> and BDCA23<i> (i=0~3) and selectively receives the column address CA0 or the inverse column address /CA0, to generate bank select signals PCBSELi (i=0~16). Each bank decoder 140, 141, . . . , 156 comprises two 3-input NAND gates G1 and G2 and a 2-input NAND gate G3 which receives the outputs from the 3-input NAND gates G1 and G2. That is, each bank decoder performs an OR operation on the decoded output from the 3-input NAND gates G1 and G2.

Four of the first through eighth bank select signals BDCA01<i> and BDCA<i> (i=0~3) are provided to the two neighboring bank decoders 140, 141, . . . or 156 in pairs. Then, the neighboring bank decoders 140, 141, . . . , or 156 generate logic high bank select signals PCBSELi (i=0~16) in response to the column address CA0 or the inverted column address /CA0. For example, the second and third bank decoders 141 and 142, for generating the bank select signals PCBSEL1 and PCBSEL2 which select the upper and lower part, respectively, of the second bank RB1 (see FIG. 1), are described blow.

For selecting the second bank RB1 (see FIG. 2), only the second bank address CBSEL<1> is provided as logic high to the first bank select signal generating circuits 132 (see FIG. 7) while the other bank addresses CBSEL<0>, CESEL<2> and CBSEL<3> are provided as logic low to the first and second bank select signal generating circuits 132 and 134. Accordingly, the first and second bank select signal generating circuits 132 and 134 (see FIG. 7) generate logic high second and fifth bank select signals BDCA01<1> and BDCA23<0>, respectively.

The second bank decoder 141 of the third bank select signal generating circuit 136 receives the first bank select signal BDCA01<0>, the fifth bank select signal BDCA23<0> and the column address CA0 through the 3-input NAND gate G1, and receives the second bank select signal BDCA01<1>, the fifth bank select signal BDCA23<0> and the column address CA0 through the 3-input NAND gate G2. The third bank decoder 142 receives the second bank select signal BDCA01<1>, the fifth bank select signal BDCA23<0> and the inverse column address /CA0 through the 3-input NAND gate and receives the third bank select signal BDCA01<2>, the fifth bank select signal BDCA23<0> and the inverse column address /CA0 through the 3-input NAND gate G2.

Thus, for selecting the second bank RB1 (see FIG. 1), the decoded logic high second bank select signal BDCA01<1> and fifth bank select signal BDCA23<0> are provided to the second and third bank decoders 141 and 142. At this time, the 3-input gate G2 of the second bank decoder 141 becomes logic low due to the inverted column select signal /CA0 for selecting the upper part of the second bank RB1 (see FIG. 1), so that the bank select signal PCBSEL1 becomes logic high. The logic high bank select signal PCBSEL1 selects the upper part of the second bank RB1 shown in FIG. 2. Conversely, the 3-input gate G1 of the third bank decoder 142 becomes logic low due to the column select signal CA0 for selecting the upper part of the second bank RB1 (see FIG. 1) and the bank select signal PCBSEL2 becomes logic high. The logic high bank select signal PCBSEL2 selects the lower part of the second bank RB1 shown in FIG. 3.

Returning to FIG. 6, the column decoder 208 decodes externally input column address CA[5:1] to generate column select signals CSLk (k=0~31). The column select signal CSLk (k=0~31) is provided to the column select circuit 120 (see FIGS. 2 and 3) in a direction parallel to the bit lines as shown in FIG. 1. The operation of the column select circuit 120 (see FIGS. 2 and 3) receiving the column select signals CSLk (k=0~31) and the logic high bank select signals PCBSEL1 and PCBSEL2 has been described. Thus, the column select signals CSLk (k=0~31) of the column select circuit 120 (see FIGS. 2 and 3) address 256 bit line pairs of each sub-block SB, in which four bit lines among the 256 bit line pairs are selected at a time. Thus, the semiconductor memory device 200 can input and output through four bit line pairs at the same time to and from one sub-block SB of one DQ block DQi (i=0~15) through the column select circuit 120 as four data input/output line pairs IOi_n (i=0~3 and n=0~31). Thus, the semiconductor memory device 200 can input and output 4 bit line data to and from each of the DQ blocks DQi (i=0~15) of the two memory blocks 202 and 204, performing a ×128 data input/output method.

Second Layout of Arrays

Figure 11:
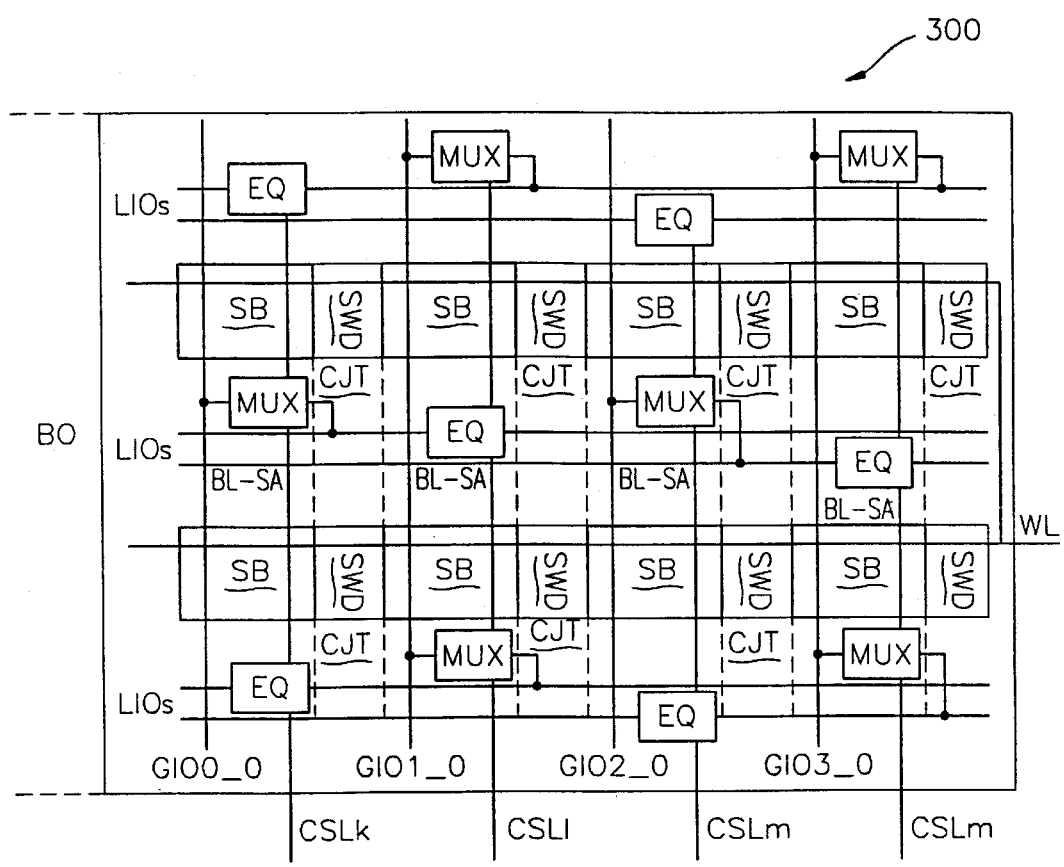
FIG. 11 schematically illustrates an alternative layout of the semiconductor memory device to that of FIG. 6, according to the present invention.

A bank B0 shown in FIG. 11 has a different architecture than the bank RB0 of FIG. 6. The bank RB0 of FIG. 6 shares the data input/output lines IOi (i=0~3) with other banks RB1, RB2, ..., RB15 (see FIG. 6) of the same DQ block DQi (i=0~15), while the bank B0 of FIG. 11 does not share the data input/output lines with other banks B1, ..., Bn, and has separate global data input/output lines GIOi_n (i=0~3 and n=number of banks). The bank RB0 of FIG. 6 is divided into sub-blocks SB in a column direction, each including 256 bit lines. However, the bank B0 of FIG. 11 includes a plurality of sub-blocks SB which are made by dividing the bank B0 in a row direction as well as in a column direction. The other banks B1, ..., Bn have the same structure as the bank B0 and may be arranged in a form of a matrix of rows and columns.

In FIG. 11, sub-word line drivers SWD are arranged between the sub-blocks SB of the bank B0 in columns, and data line equalizers EQ for equalizing local data lines LIOs and switching portions MUX for connecting the local data lines LIOs to the global data input/output line GIOi_n (i=0~3 and n=number of banks) are arranged between the sub-blocks SB in rows, in bit line sense amplifier regions for sensing bit line data. The local data lines LIOs are nearly the same as the second data lines SDL of the column select circuit 120 of FIG. 2, and the global data input/output lines GIOi_n are nearly the same as the data input/output lines IO of FIG. 2. In addition, the data line equalizers EQ are the same as the data line equalizer 114 of FIG. 2, and the switching portions MUX are the same as the third data select portion 126 of FIG. 2.

In the semiconductor memory device 300 having this layout, the equalizer signal LAEQ and PMOS sensing enable signal LAPG of the sense amplifier power driver 116 (see FIG. 4) are provided into the bit line sense amplifier regions. Thus, the data line equalizers EQ and the switching portions MUX can be installed in the bit line sense amplifier regions without the need to add a control signal line.

Third Layout of Arrays

Figure 12:
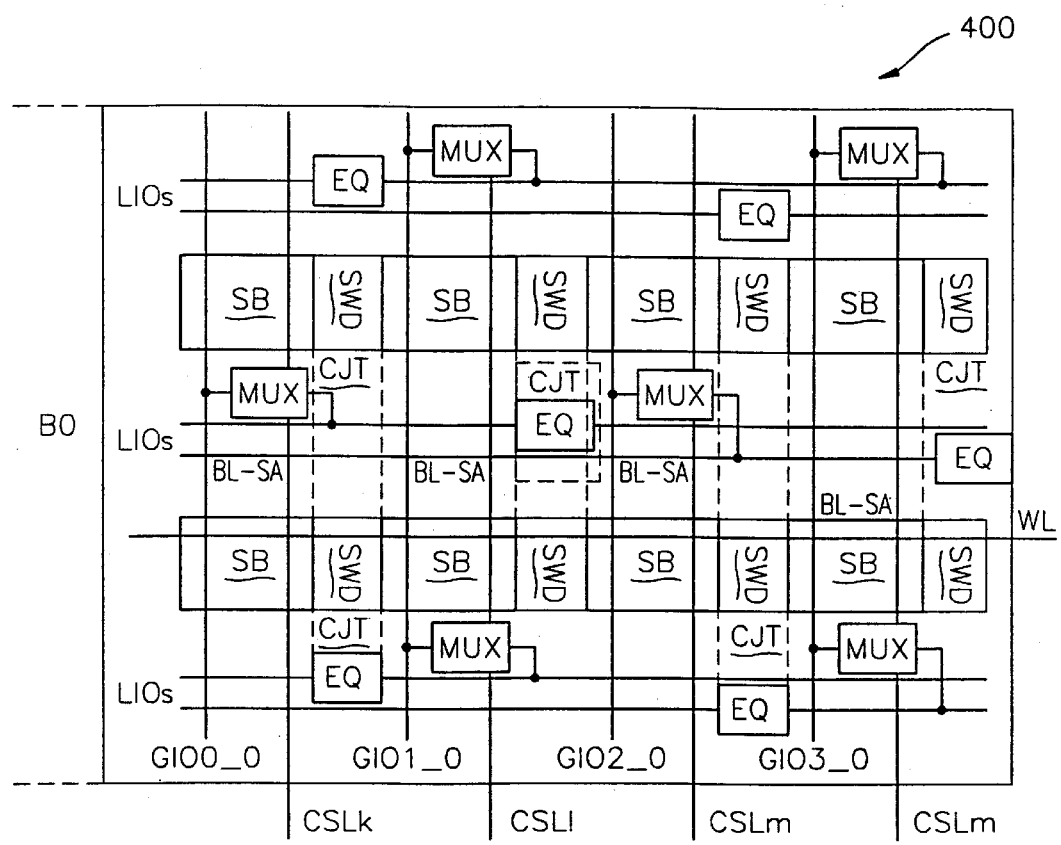
FIG. 12 schematically illustrates another alternative layout of the semiconductor memory device that of FIGS. 6 and 11.

The layout of FIG. 12 is nearly the same as that of FIG. 11. However, data line equalizers of FIG. 12 are arranged in the conjunctions CJT described in FIG. 6 while the data line equalizers EQ of FIG. 11 are arranged in the bit line sense amplifier regions, and sense amplifier power drivers LA/LAB (not shown) are also arranged in the conjunctions CJT. This means that arranging the switching portions MUX, which affects the operational speed of a semiconductor memory device, in the bit line sense amplifier regions is advantageous to the high-speed operation of the semiconductor memory device 300. Meanwhile, the data line equalizers EQ and the sense amplifier power drivers LA/LAB, which have less effect on the operational speed, can be arranged in the conjunctions CJT, because the equalizer signal LAEQ provided to the sense amplifier power driver LA/LAB 116 (see FIG. 4) can be used as a control signal for the data line equalizers EQ.

Comparative Example

Figure 13:
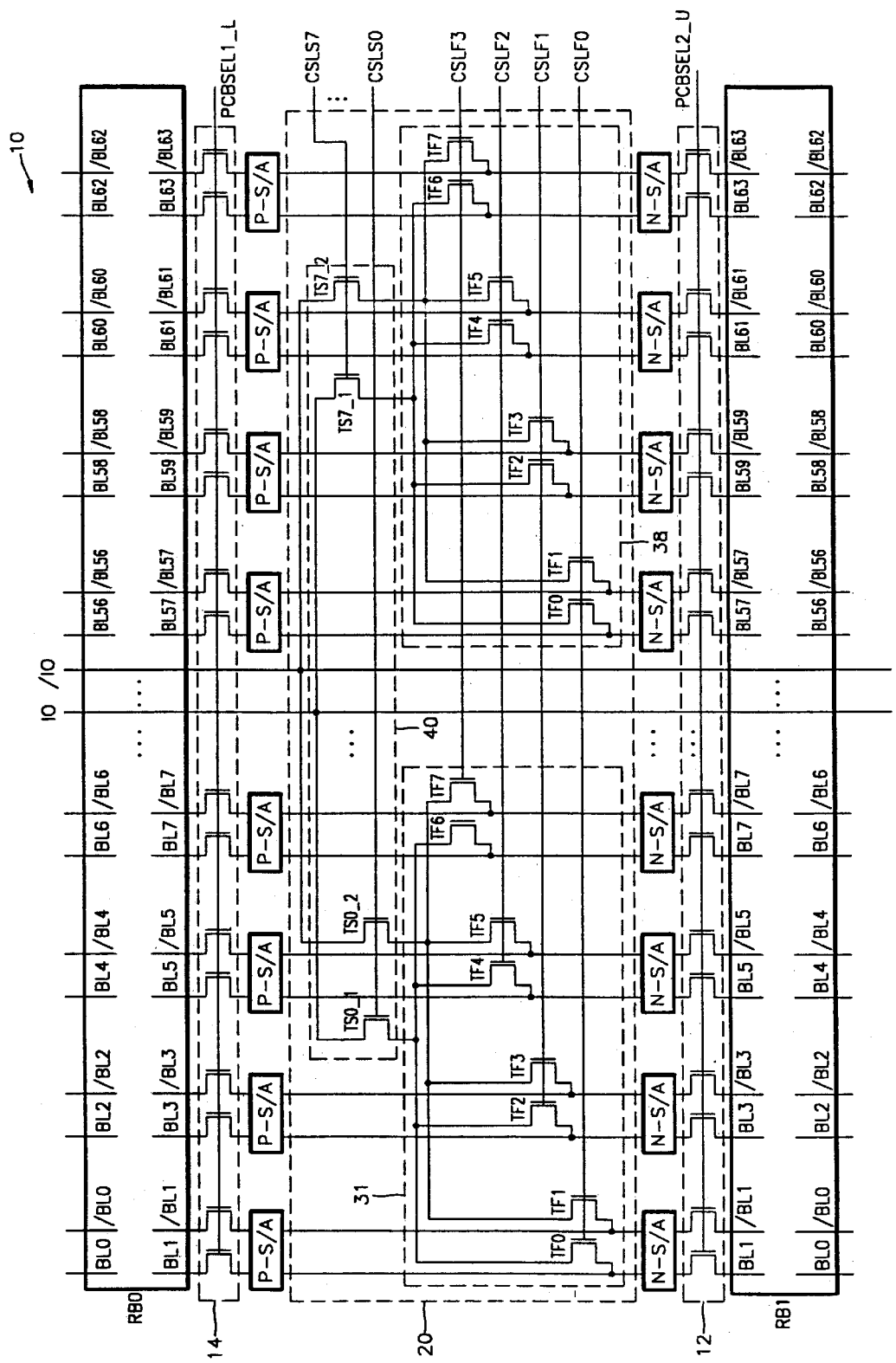
FIG. 13 contains a detailed schematic diagram of a portion of a semiconductor memory device having a column select circuit as a comparative example to the column select circuit of FIG. 2, according to the present invention.

FIG. 13 shows a semiconductor memory device 10 having a column select circuit as a comparative example to the column selection circuit 120 of FIG. 2. Referring to FIG. 13, a column select circuit 20 of the semiconductor memory device 10 selects one bit line pair among 32 bit line pairs of the selected bank as in the column select circuit 120 of FIG. 2. However, the semiconductor memory device 10 of FIG. 13 further includes separating portions 12 and 14. Also, the column select circuit 20 includes 4:1 column selecting portions 31, ..., 38 and an 8:1 column selecting portion 40, unlike the column select circuit 120 of FIG. 2 having the first, second and third select portions 122, 124 and 126.

The separating portions 12 and 14 of the semiconductor memory device 10 include NMOS transistors having gates connected to bank select signals PCBSELi, and connect the selected bank to the column select circuit 20. The separating portions 12 and 14 are arranged between the column select circuit 20 shared by the neighboring banks RB0 and RB1, and the lower and upper parts of the respective neighboring banks RB0 and RB1, and connect the selected bank to the column select circuit 20 and separate the non-selected bank from the column select circuit 20. In other words, when bank select signal PCBSEL2_U for selecting the upper part of the second bank RB1 is enabled, the NMOS transistors of the separating portion 12 located above the upper part of the second bank RB1 are turned on, so that the odd bit line pairs BLi and /BLi (i=2n+1 and n=0~31) of the second bank RB1 are connected to the column select circuit 20.

The column select circuit 20 comprises eight 4:1 column select portions 31, ..., 38 and one 8:1 column select portion 40. Each 4:1 column select portion 31, ..., 38 selects one bit line pair among four cell bit line pairs in response to first column select signals CSLF0, CSLF1, CSLF2 and CSLF3 applied to first column select transistors TFi (i=0~7), respectively, and transfers the selected bit line pair to the 8:1 column select portion 40. The 8:1 column select portion 40 selects one of the outputs from the eight 4:1 column select portions 31, ..., 38, in response to second column select signals CSLS0, CSLS1, ..., CSLS7 applied to second column select transistors TSi_1 and TSi_2 (i=0~7), respectively, and transfers the selected output to data input/output line pair IO and /IO.

However, the data input/output line IO connected to the upper and lower parts of the second bank RB1 in the column select circuit 20 is provided with a large junction load from the 16 second column select transistors TSi_1 and TSi_2 (i=0~7). The result is that the column select circuit 120 of FIG. 2 according to the present invention can minimize the junction load, in comparison to the column select circuit 20 of FIG. 3.

Also, the semiconductor memory device 10 of FIG. 13 provides the column select circuit 20 with the first and second column select signals CSLFi and CSLSj (i=0~3 and j=0~7) in a direction perpendicular to the bit lines and parallel to the word lines. However, for such architecture, the lines of the first and second column select signals CSLFi and CSLSj (i=0~3 and j=0~7) must be arranged in the conjunction (CJT) regions as described in the semiconductor memory device 200 of FIG. 6, and thus the conjunction area increases. As a result, the sub-word line driver (SWD) regions are enlarged, thereby increasing the chip size.

Also, due to the occupation of the semiconductor memory device by the second column select transistors TSi_1 and TSi_2 (i=0~7) in the 8:1 column select portion 40, the data line equalizer 114 and the sense amplifier power driver 116 are arranged in the conjunctions (CJT), as shown in FIG. 6, instead of being arranged in the column select circuit 120, unlike in the column select circuit 120 (see FIG. 2), so that the chip size is further increased. That is, the semiconductor memory device according to the present invention has the advantage of a smaller size than the semiconductor memory device of FIG. 13.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A semiconductor memory device having at least one column select circuit, each column select circuit for selecting one of at least two banks in a memory block and selecting a predetermined bit line among a plurality of bit lines in the selected bank, to transfer data of the selected bit line to a data input/output line, wherein the at least one column select circuit comprises:
   a plurality of first select portions for connecting the bit lines of the selected bank to the corresponding first data lines in response to a bank select signal to select a predetermined bank;
   a plurality of second select portions for connecting the first data lines to a second data line in response to each column select signal which represents the address of each bit line; and
   a third select portion for connecting the second data line to the data input/output lines in response to the bank select signal,
   wherein the second data line shared by the second and third select portions is connected to at least one of the first data lines which is responsive to the column select signal.

2. The column select circuit of claim 1, wherein the signal lines for the column select signals are arranged in a direction parallel to the bit lines.

3. The column select circuit of claim 1, wherein the column select signal is the signal which is decoded to select bit lines in the selected bank.

4. The column select circuit of claim 1, wherein the signal line for the bank select signal is arranged perpendicular to the bit lines.

5. The column select circuit of claim 1, wherein the data input/output line is shared by the plurality of banks and is connected to the third select portion of at least one column select circuit.

6. The column select circuit of claim 1, wherein the first, second and third select portions comprise NMOS transistors.

7. The column select circuit of claim 6, wherein an NMOS transistor of the first select portion has a gate connected to the bank select signal, a source connected to the bit line and a drain connected to the first data line.

8. The column select circuit of claim 6, wherein an NMOS transistor of the second select portion has a gate connected to the column select signal, a source connected to the first data line and a drain connected to the second data line.

9. The column select circuit of claim 6, wherein an NMOS transistor of the third select portion has a gate connected to the bank select signal, a source connected to the second data line, and a drain connected to the data input/output line.

10. A semiconductor memory device for selecting a bank among a plurality of banks sharing data input/output lines, the banks are arranged in rows and columns, and selecting a predetermined bit line among a plurality of bit lines in the selected bank, to transfer the data of the selected bit line to the data input/output lines, the semiconductor memory device comprising column select circuits arranged between the banks, each column select circuit shared by neighboring banks, for transferring data of the selected bit line to the data input/output lines, wherein each column select circuit comprises:
   a plurality of first select portions for connecting the bit lines of the selected bank to the corresponding first data lines in response to a bank select signal to select a predetermined bank;
   a plurality of second select portions for connecting the first data lines to a second data line in response to each column select signal which represents the address of each bit line; and
   a third select portion for connecting the second data line to the data input/output lines in response to the bank select signal.

11. The semiconductor memory device of claim 10, wherein the signal lines for the column select signals are arranged in a direction parallel to the bit lines.

12. The semiconductor memory device of claim 10, wherein the bit lines of the banks are divided into even bit lines and odd bit lines, and the column select circuit is shared by the even bit lines or the odd bit lines of the neighboring banks.

13. An arrangement method for a semiconductor memory device for selecting a bank among at least two banks which share data input/output lines, the banks being arranged in units of memory blocks, and selecting a predetermined bit line among a plurality of bit lines in the selected bank, to transfer the data of the selected bit line to the data input/output lines, the method comprising:
   providing a bit line sense amplifier for sensing the data of the bit lines;
   providing a column select circuit for (i) connecting the bit lines of the selected bank to the corresponding first data lines through first select portions in response to a bank select signal to select a predetermined bank, (ii) connecting the first data lines to a second data line through second select portions in response to each column select signal which represents the address of each bit line, and (iii) connecting the second data line to the data input/output lines through a third select portion in response to the bank select signals,
   providing a sense amplifier power driver for supplying power voltage to the bit line sense amplifier;
   providing a data line equalizer for equalizing the second data line; and
   arranging the third select portion in the bit line sense amplifier region between the banks.

14. The arrangement method of claim 13, further comprising arranging the data line equalizer in the bit line sense amplifier region.

15. The arrangement method of claim 14, further comprising arranging the sense amplifier power driver in the bit line sense amplifier region.

16. The arrangement method of claim 13, further comprising arranging the sense amplifier power driver in the bit line sense amplifier region.

17. An arrangement method for a semiconductor memory device including banks each having separate global data input/output lines, and memory blocks in which a plurality of sub-blocks obtained by dividing a bank in rows and columns are arranged, the semiconductor memory device selecting one of the banks and selecting a predetermined bit line among a plurality of bit lines of the selected bank to transfer the data of the selected bit line to the global data input/output lines, the semiconductor memory device comprising:

a bit line sense amplifier for sensing the data of the bit lines;

switching portions for connecting local data lines to which the sensed bit line data is transferred to the global data input/output lines; and data line equalizers for equalizing the local data lines, wherein the switching portion is arranged in the bit line sense amplifier region among the sub-blocks.

18. The arrangement method of claim 17, wherein the data line equalizers are arranged in the bit line sense amplifier region.

19. The arrangement method of claim 18, wherein the sense amplifier power driver is arranged in the bit line sense amplifier region.

20. The arrangement method of claim 17, wherein the sense amplifier power driver is arranged in the bit line sense amplifier region.

* * * * *